(12) United States Patent
Lowrey

(10) Patent No.: US 6,586,761 B2
(45) Date of Patent: Jul. 1, 2003

(54) PHASE CHANGE MATERIAL MEMORY DEVICE

(75) Inventor: Tyler A. Lowrey, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/948,830

(22) Filed: Sep. 7, 2001

(65) Prior Publication Data

US 2003/0047762 A1 Mar. 13, 2003

(51) Int. Cl.⁷ .......................... H01L 47/00; H01L 23/48
(52) U.S. Cl. .................. 257/3; 257/2; 257/4; 257/5; 257/751; 257/296
(58) Field of Search ............................. 257/2, 3, 4, 5, 257/751, 296, 910; 438/584, 257

(56) References Cited

U.S. PATENT DOCUMENTS 5,470,628 A * 11/1995 Tominaga et al. ......... 428/64.4
5,534,712 A * 7/1996 Ovshinsky et al. ............. 257/3
2001/0023119 A1 * 9/2001 Reinberg ..................... 438/584

* cited by examiner

Primary Examiner—Minh Loan Tran
Assistant Examiner—Tan Tran
(74) Attorney, Agent, or Firm—Trop, Pruner & Hu, P.C.

(57) ABSTRACT

A phase change material memory cell may be formed with singulated, cup-shaped phase change material. The interior of the cup-shaped phase change material may be filled with a thermal insulating material. As a result, heat losses upwardly through the phase change material may be reduced and adhesion problems between the phase change material and the rest of the device may likewise be reduced in some embodiments. In addition, a barrier layer may be provided between the upper electrode and the remainder of the device that may reduce species incorporation from the top electrode into the phase change material, in some embodiments. Chemical mechanical planarization may be utilized to define the phase change material reducing the effects of phase change material dry etching in some embodiments.

12 Claims, 3 Drawing Sheets

PHASE CHANGE MATERIAL MEMORY DEVICE

BACKGROUND

This invention relates generally to electronic memories and particularly to electronic memories that use phase change material.

Phase change materials may exhibit at least two different states. The states may be called the amorphous and crystalline states. Transitions between these states may be selectively initiated. The states may be distinguished because the amorphous state generally exhibits higher resistivity than the crystalline state. The amorphous state involves a more disordered atomic structure. Generally any phase change material may be utilized. In some embodiments, however, thin-film chalcogenide alloy materials may be particularly suitable.

The phase change may be induced reversibly. Therefore, the memory may change from the amorphous to the crystalline state and may revert back to the amorphous state thereafter, or vice versa, in response to temperature changes. In effect, each memory cell may be thought of as a programmable resistor, which reversibly changes between higher and lower resistance states. The phase change may be induced by resistive heating.

In some embodiments, the cell may have a large number of states. That is, because each state may be distinguished by its resistance, a number of resistance determined states may be possible, allowing the storage of multiple bits of data in a single cell.

A variety of phase change alloys are known. Generally, chalcogenide alloys contain one or more elements from Column VI of the periodic table. One particularly suitable group of alloys is the GeSbTe alloys.

A phase change material may be formed within a passage or pore through an insulator. The phase change material may be coupled to upper and lower electrodes on either end of the pore.

One problem that arises is that the adherence between the insulator and the phase change material may be poor. One solution to this problem is to provide an interfacial layer that promotes adhesion between the insulator and the phase change material. Generally, suitable interfacial layers are conductors such as titanium.

In particular, because of the use of extended lengths of phase change material, the possibility of separation arises. The use of column stripes of phase change material may require adhesion along long stripes despite the thermal expansion and contraction from subsequent processing steps. There is also accumulative stress along the column line from the phase change material stack itself and from subsequent thin-film depositions required as part of integration into an integrated circuit process flow.

Alternatively, a glue layer may be positioned between the insulator and the phase change material. However, the glue layer may degrade the phase change material or add processing cost.

Another issue with existing phase change memories is upwardly directed heat loss through the cell. The more the heat loss, the greater the programming current that is required since heat is utilized to induce the programming phase change.

Still another problem is the incorporation of species from the upper electrode into the phase change material. Species incorporation can have detrimental effects on programming properties of the phase change material.

Yet another issue with existing phase change material memories is the need for dry etching of the phase change material. The dry etch of a phase change material stack is a complicated process. Issues of undercut and re-entrant profiles may be encountered.

Thus, there is a need for better designs for phase change memories that may be manufactured using more advantageous techniques.

DETAILED DESCRIPTION

Figure 1:
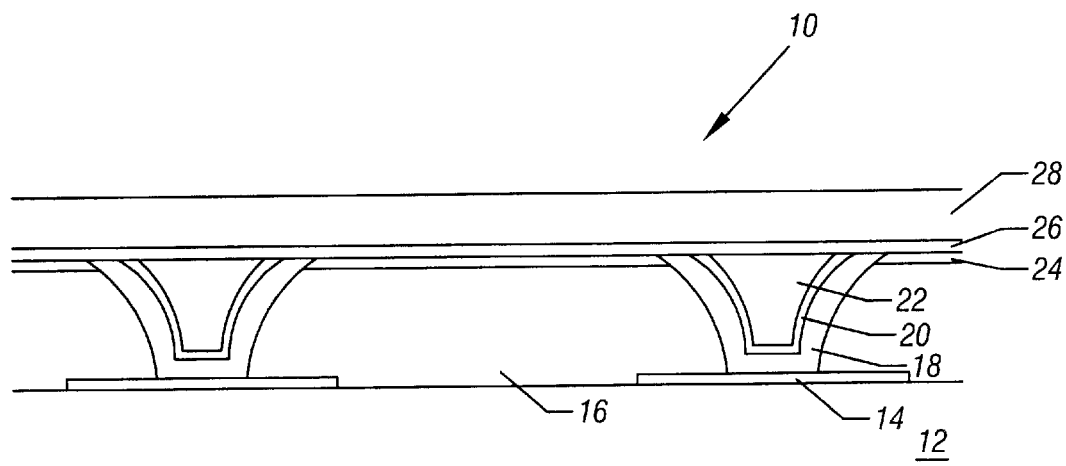
FIG. 1 is an enlarged, cross-sectional view in accordance with one embodiment of the present invention.

Referring to FIG. 1, a phase change memory cell 10 may be formed on a substrate 12 that in one embodiment may be a silicon substrate. A pair of lower electrodes 14 may be formed over the substrate 12. The electrodes 14 may be separated by an insulator 16. A pore may be formed above the lower electrode 14 between the lower electrode 14 and the top electrode 28. The pore may include a tapered, cup-shaped phase change material 18 covered by a similarly shaped barrier layer 20. A fill insulator 22 may fill the central portion of the barrier 20 and the phase change material 18. An etch stop layer 24 underlies a barrier layer 26 that in turn underlies the top electrode 28.

Figure 2:
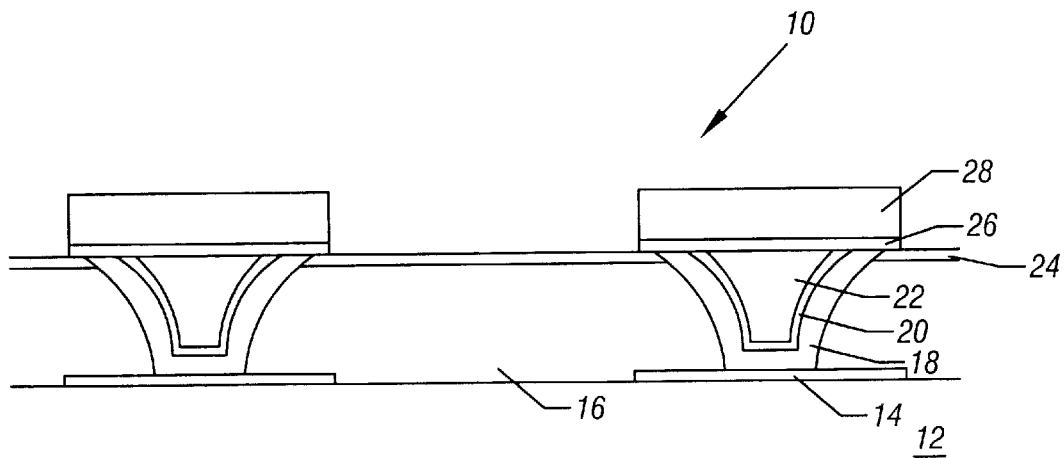
FIG. 2 is an enlarged, cross-sectional view of the device shown in FIG. 1 taken transversely to the view shown in FIG. 1.
Figure 3:
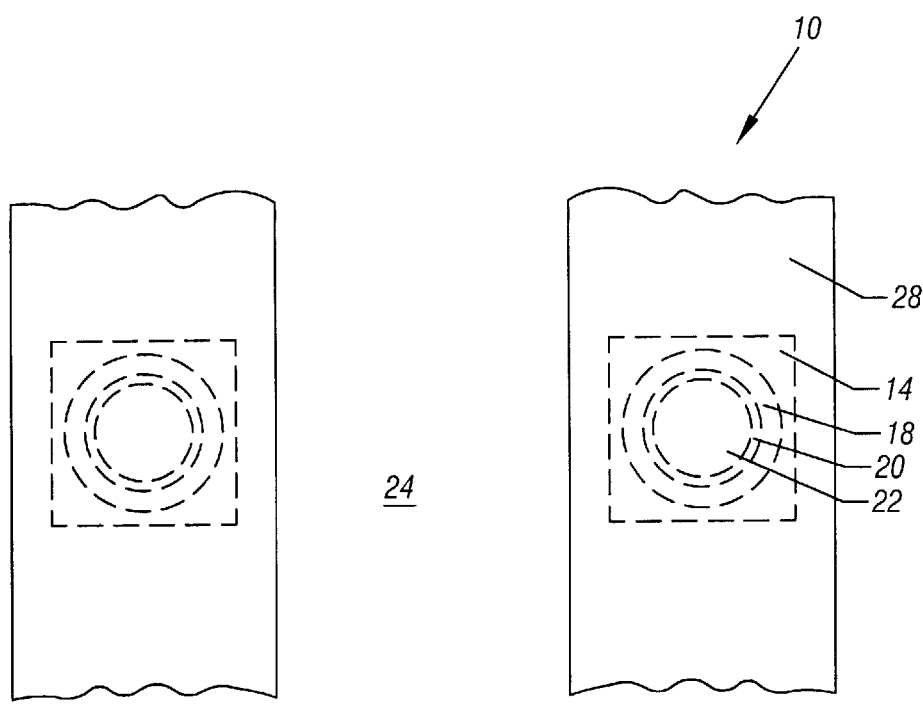
FIG. 3 is a top plan view of the embodiment shown in FIGS. 1 and 2.

Referring to FIG. 2, the top electrode 28 extends along two adjacent pores. The pores may be separated by an insulator 16. Cells defined by the pores may be distributed in large numbers across the substrate 12 in some embodiments. As viewed from above in FIG. 3, each electrode 28 covers a plurality of pores including the elements 14, 18, 20 and 22, separated by insulator 16 covered by an etch stop layer 24.

Figure 4:
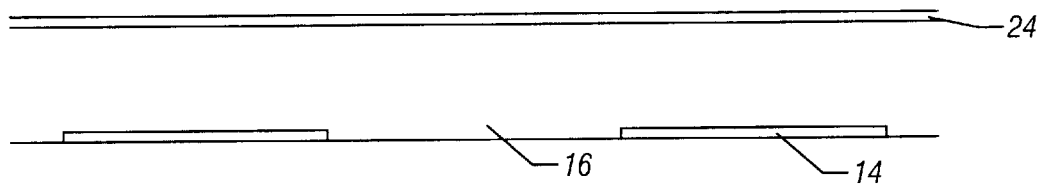
FIG. 4 is an enlarged cross-sectional view of the initial processing of the structure of FIG. 1 in accordance with one embodiment of the present invention.

A technique for forming the memory cells 10, according to one embodiment, may involve initially forming the lower electrodes 14 on a substrate 12 using conventional patterning and deposition techniques, as shown in FIG. 4. Any conventional technique may be utilized to form the electrodes 14. The electrodes 14 may be formed of a variety of conductors including cobalt silicide.

The insulator 16 may then be deposited over the patterned lower electrodes 14. In one embodiment, the insulator 16 is an electrical and thermal insulator. One suitable material is silicon dioxide that may be from about 50 to 1500 Angstroms thick in one embodiment. Next a planarization such as, for example, a chemical mechanical planarization (CMP) is performed to achieve global and local planarity. This may be followed by the deposition, if desired, of a CMP etch stop layer 24. The layer 24 may be silicon nitride or polysilicon having a thickness from 10 to 1000 Angstroms in one embodiment.

Figure 5:
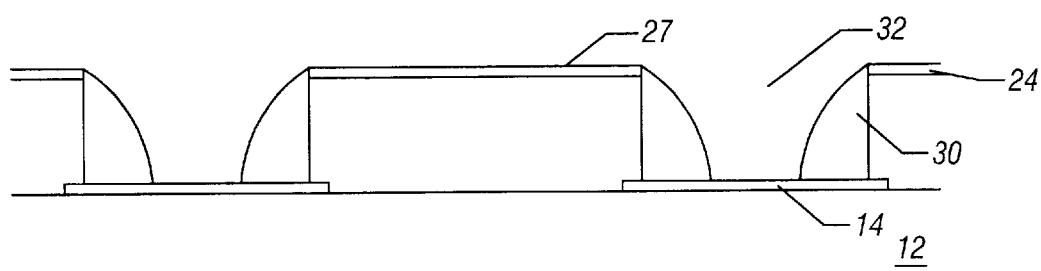
FIG. 5 shows subsequent processing on the structure shown in FIG. 4 in accordance with one embodiment of the present invention.

Referring next to FIG. 5, the pore openings 32, defined through the etch stop layer 24, receive a side wall spacer 30. The side wall spacer 30 may be formed using standard techniques of depositing an insulating layer and selectively anisotropically dry etching that layer from the lower electrode 14 and the etch stop layer 24. An insulating spacer 30 may be made of silicon dioxide or nitride such as $Si_3N_4$. The thickness of the insulating spacer 30 may be in the range of 50 to 2000 Angstroms in one embodiment.

Figure 6:
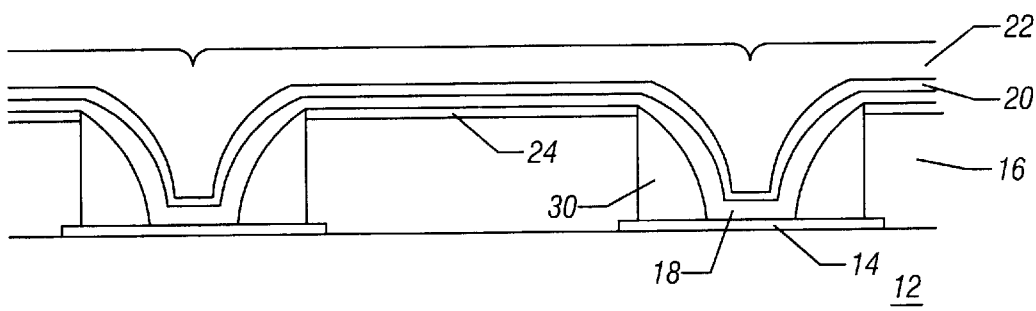
FIG. 6 shows subsequent processing of the structure shown in FIG. 5 in accordance with one embodiment of the present invention.

Turning next to FIG. 6, deposited in a sequential fashion over the structure shown in FIG. 5 may be the phase change layer 18, barrier layer 20, and fill insulator 22, in one embodiment. The phase change material 18 may be a chalcogenide-based material such as $Ge_2Sb_2Te_5$ with a thickness of 50 to 1000 Angstroms in one embodiment. The barrier material 20 may be, for example, titanium, titanium nitride or titanium-tungsten, for example, with a thickness in the range of 10 to 500 Angstroms. The fill insulator 22 may be any insulator with low thermal and electrical conductivity. Examples of suitable fill insulator 22 materials include silicon dioxide or silicon nitride, such a $Si_3N_4$ with a thickness of about 500 to 10,000 Angstroms, for example.

Figure 7:
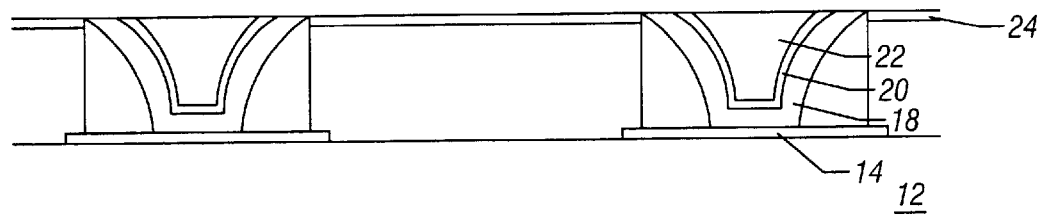
FIG. 7 shows subsequent processing of the embodiment shown in FIG. 6 in accordance with one embodiment of the present invention.

Turning finally to FIG. 7, CMP removes the fill insulator 22, barrier layer 20, and phase change material 18 in all regions above the etch stop layer 24. CMP thereby defines the structure of the phase change material 18 while eliminating the need for a dry etch in one embodiment. As mentioned earlier, the use of the dry etch may complicate the process flow and raise issues of undercut and re-entrant profiles. Moreover, because the phase change material 18 is defined within an encapsulated, singulated region, the problem of adhesion between the phase change material 18 and the surrounding materials may be substantially reduced or even eliminated, even after exposure to ensuing thermal stresses.

The imposition of the insulator 22 over the phase change material 18 reduces upward thermal losses. Thermal losses may result in the need for greater programming currents to obtain the same programming effect.

As shown in FIG. 1, the structure of FIG. 7 may be covered with a barrier layer 26 and a top electrode 28. In one embodiment, the barrier layer 26 may be titanium, titanium nitride, or titanium-tungsten at a thickness in the range of 10 to 500 Angstroms. The top electrode 28 may be aluminum copper alloy in one embodiment with a thickness in the range of 200 to 20,000 Angstroms. The use of a barrier layer 26 may reduce the incorporation of species from the top electrode 28 into the phase change material 18 in some embodiments. The top electrode 28 and barrier layer 26 may be patterned using standard photolithographic and dry etching techniques to achieve the structures shown in FIGS. 1, 2, and 3.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A memory comprising:
   a support structure;
   an insulator over said support structure, said insulator having an opening defined in said insulator;
   a cup-shaped phase change material in said opening, said cup-shaped phase change material arranged substantially entirely within said opening in said insulator.

2. The memory of claim 1 including an insulator in said cup-shaped phase change material.

3. The memory of claim 1 wherein said phase change material is encapsulated.

4. The memory of claim 1 wherein said phase change material is singulated.

5. The memory of claim 1 wherein said cup-shaped phase change material includes a cup-shaped portion, said cup-shaped portion being filled with an insulator.

6. The memory of claim 1 including a side wall spacer in said opening.

7. A memory comprising:
   a support structure;
   an insulator over said support structure, said insulator having an opening defined in said insulator; and
   a cup-shaped phase change material in said opening, said phase change material including an upper surface and said insulator including an upper surface, said upper surfaces of said insulator and said phase change material being substantially coplanar.

8. The memory of claim 7 wherein said phase change material includes a cup-shaped portion and a filler insulator formed in said cup-shaped portion.

9. The memory of claim 7 wherein said filler insulator includes an upper surface, the upper surface of said insulator being substantially coplanar with the upper surfaces of said filler insulator and said phase change material.

10. The memory of claim 7 wherein said phase change material is singulated.

11. The memory of claim 7 wherein said phase change material is encapsulated.

12. The memory of claim 7 including a side wall spacer in said opening.

* * * * *